US012628387B2

(12) United States Patent
Chen et al.

(10) Patent No.: US 12,628,387 B2
(45) Date of Patent: May 12, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventors: Chin-Hung Chen, Tainan City (TW); Ssu-I Fu, Kaohsiung City (TW); Yu-Hsiang Lin, New Taipei City (TW); Po-Kuang Hsieh, Kaohsiung City (TW); Jia-He Lin, New Taipei City (TW); Sheng-Yao Huang, Kaohsiung City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 430 days.

(21) Appl. No.: 18/196,441

(22) Filed: May 12, 2023

(65) Prior Publication Data

US 2024/0347588 A1 Oct. 17, 2024

(30) Foreign Application Priority Data

Apr. 11, 2023 (TW) .................................. 112113476

(51) Int. Cl.
H10D 62/10 (2025.01)
H01L 21/762 (2006.01)

(52) U.S. Cl.
CPC ..... H10D 62/115 (2025.01); H01L 21/76229 (2013.01)

(58) Field of Classification Search
CPC ......... H01L 21/76224; H01L 21/76229; H01L 21/761; H01L 21/763; H01L 21/28008; H01L 23/481; H01L 21/308; H01L 21/30604; H10D 62/115; H10D 84/0188; H10D 84/85; H10D 84/0179; H10D 84/0167; H10D 84/856; H10D 84/038; H10D 86/01; H10D 84/0144; H10D 84/0181; H10D 84/0191; H10D 84/859; H10D 84/0109; H10D 84/409; H10D 84/0177; H10D 84/0193; H10D 64/691; H10D 84/0151; H10D 84/853; H10D 84/83; H10D 84/0142; H10D 84/0158; H10D 84/0128; H10D 84/834; H10D 84/017; H01P 1/15
See application file for complete search history.

(56) References Cited

U.S. PATENT DOCUMENTS

| | | | | |
|---|---|---|---|---|
| 9,330,956 B1 * | 5/2016 | Lo | ...................... | H01L 21/76224 |
| 9,390,962 B1 * | 7/2016 | Ko | ..................... | H01L 21/76229 |
| 9,653,365 B1 * | 5/2017 | Lim | ....................... | H10D 87/00 |
| 11,183,429 B2 * | 11/2021 | Kang | ................. | H10D 84/0181 |

(Continued)

*Primary Examiner* — Mouloucoulaye Inoussa
(74) *Attorney, Agent, or Firm* — Winston Hsu

(57) ABSTRACT

A method for fabricating a semiconductor device includes the steps of first providing a substrate having a high-voltage (HV) region and a medium-voltage (MV) region, forming a first trench on the HV region, forming a second trench adjacent to the first trench and extending the first trench to form a third trench, forming a first shallow trench isolation (STI) in the second trench and a second STI in the third trench, and then forming a first gate structure between the first STI and the second STI. Preferably, a bottom surface of the second STI is lower than a bottom surface of the first STI.

20 Claims, 14 Drawing Sheets

(56) References Cited

U.S. PATENT DOCUMENTS

| | | | | |
|---|---|---|---|---|
| 2004/0145020 | A1* | 7/2004 | Kang | H10B 69/00 |
| | | | | 257/350 |
| 2006/0006462 | A1* | 1/2006 | Chang | H10D 84/038 |
| | | | | 257/E21.549 |
| 2006/0134845 | A1* | 6/2006 | Pham | H10B 41/40 |
| | | | | 438/207 |
| 2007/0252731 | A1* | 11/2007 | Chung | H10D 84/0191 |
| | | | | 257/E27.032 |
| 2008/0185660 | A1* | 8/2008 | Choi | H10D 84/0181 |
| | | | | 257/E21.639 |
| 2009/0302413 | A1* | 12/2009 | Kang | H01L 21/76229 |
| | | | | 118/620 |
| 2010/0252870 | A1 | 10/2010 | Lin et al. | |
| 2011/0260294 | A1* | 10/2011 | Oh | H01L 21/76232 |
| | | | | 438/424 |
| 2012/0034783 | A1* | 2/2012 | Entalai | H01L 21/76232 |
| | | | | 438/694 |
| 2018/0013421 | A1* | 1/2018 | Park | H03K 17/6871 |
| 2020/0105748 | A1* | 4/2020 | Chen | H10D 84/0144 |
| 2020/0144101 | A1* | 5/2020 | Hsu | H10D 62/115 |
| 2021/0118725 | A1* | 4/2021 | Julien | H01L 25/16 |
| 2022/0115508 | A1* | 4/2022 | Lin | H10D 84/0142 |
| 2022/0352161 | A1* | 11/2022 | Chen | H10D 84/0177 |
| 2022/0359680 | A1* | 11/2022 | Lin | H01L 21/76816 |
| 2023/0154922 | A1* | 5/2023 | Yang | H10D 84/0144 |
| | | | | 257/369 |
| 2023/0178438 | A1* | 6/2023 | Weng | H10D 84/013 |
| | | | | 438/294 |
| 2023/0197523 | A1* | 6/2023 | Hsu | H10D 84/0158 |
| | | | | 257/392 |
| 2023/0197710 | A1* | 6/2023 | Hsu | H10D 64/027 |
| | | | | 257/355 |
| 2023/0197725 | A1* | 6/2023 | Weng | H01L 21/761 |
| 2023/0253496 | A1* | 8/2023 | Li | H10D 84/0158 |
| | | | | 257/192 |
| 2024/0357791 | A1* | 10/2024 | Yuan | G03F 7/162 |

* cited by examiner

SEMICONDUCTOR DEVICE AND METHOD FOR FABRICATING THE SAME

BACKGROUND OF THE INVENTION

1. Field of the Invention

The invention relates to a method of fabricating semiconductor device, and more particularly to a method of integrating high-voltage (HV) device, medium-voltage (MV) device, and low-voltage (LV) device.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of high-voltage devices and FinFET devices start to face numerous challenges such as current leakage and control of breakdown voltage. Hence, how to improve the current fabrication for improving performance of the device has become an important task in this field.

SUMMARY OF THE INVENTION

According to an embodiment of the present invention, a method for fabricating a semiconductor device includes the steps of first providing a substrate having a high-voltage (HV) region and a medium-voltage (MV) region, forming a first trench on the HV region, forming a second trench adjacent to the first trench and extending the first trench to form a third trench, forming a first shallow trench isolation (STI) in the second trench and a second STI in the third trench, and then forming a first gate structure between the first STI and the second STI. Preferably, a bottom surface of the second STI is lower than a bottom surface of the first STI.

According to another aspect of the present invention, a semiconductor device includes a substrate having a high-voltage (HV) region and a medium-voltage (MV) region, a first shallow trench isolation (STI) and a second STI in the substrate of the HV region, and a first gate structure between the first STI and the second STI. Preferably, a bottom surface of the second STI is lower than a bottom surface of the first STI.

According to yet another aspect of the present invention, a semiconductor device includes a substrate having a high-voltage (HV) region and a medium-voltage (MV) region, a first shallow trench isolation (STI) and a second STI in the substrate of the MV region, and a first gate dielectric layer between the first STI and the second STI. Preferably, a first thickness closer to a center of the first gate dielectric layer and a second thickness closer to a first side of the first gate dielectric layer are different.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 9-14 illustrate a method for fabricating a semiconductor device according to an embodiment of the present invention.

DETAILED DESCRIPTION

Figure 1:
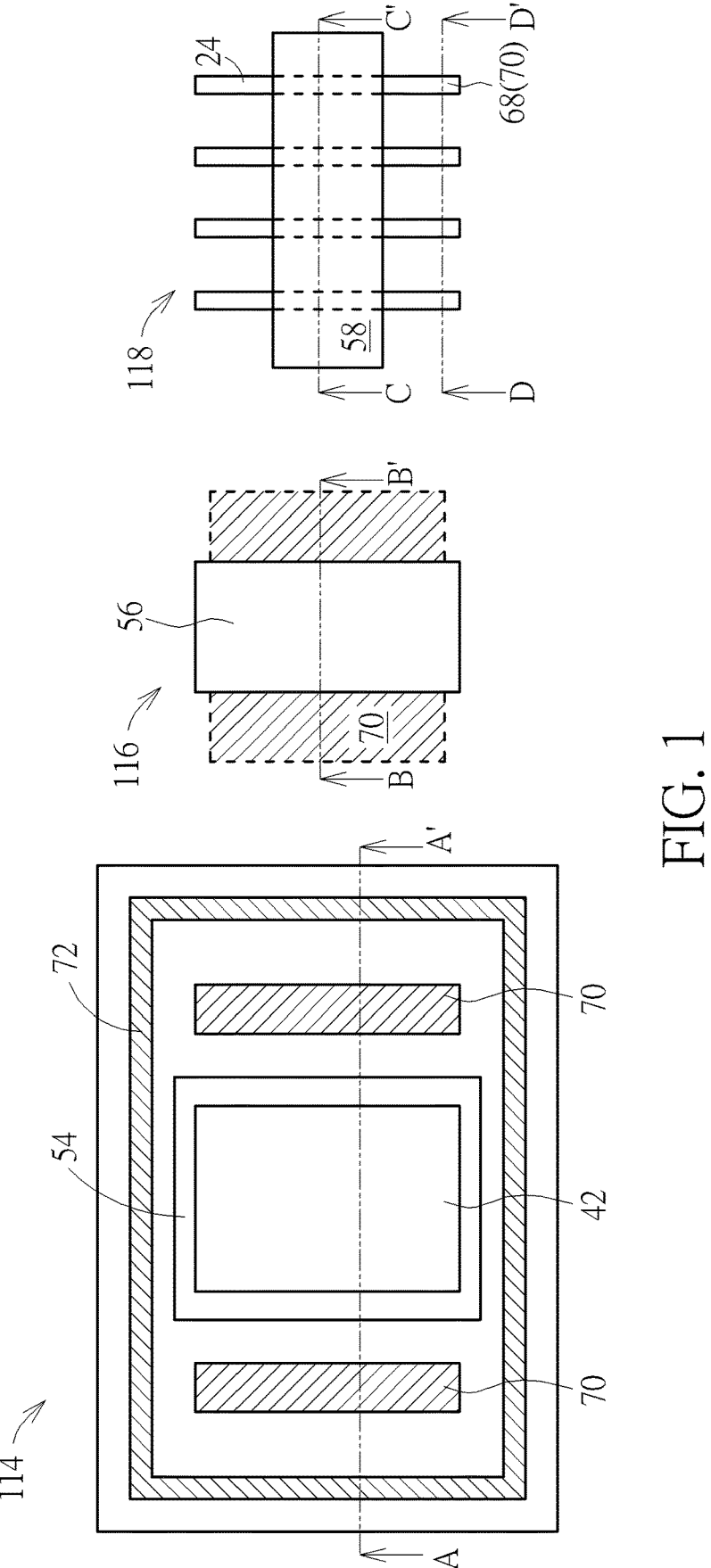
FIGS. 1-11 illustrate a method for fabricating a semiconductor device according to an embodiment of the present invention.
Figure 2:
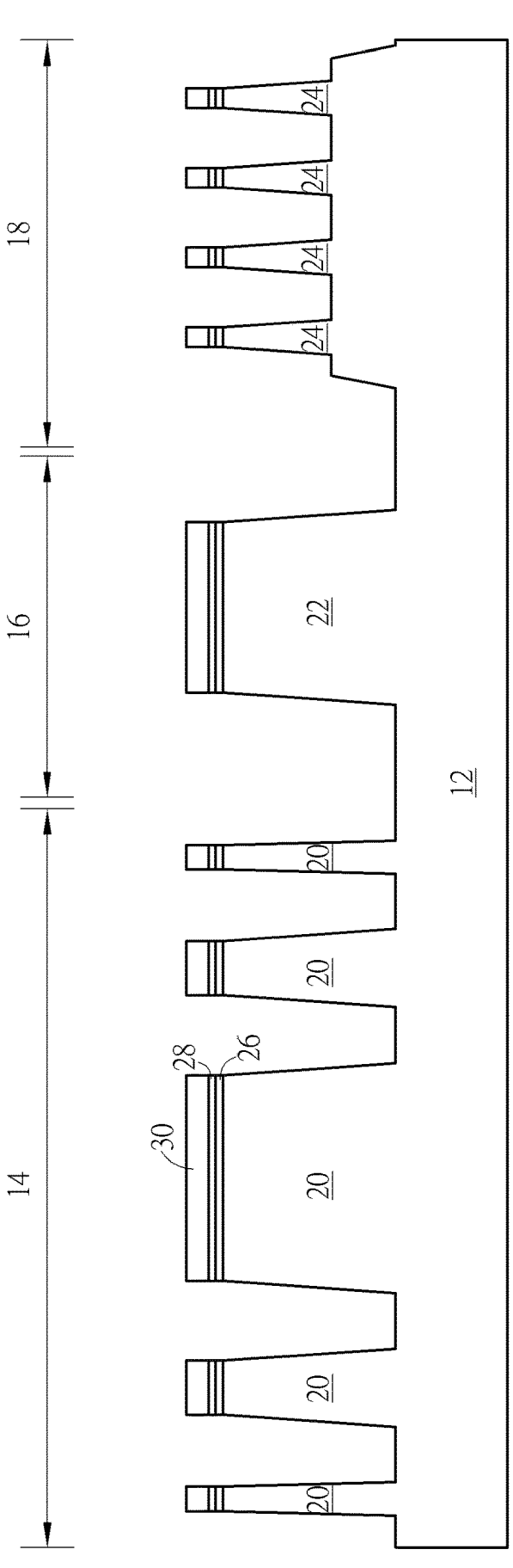

Referring to FIGS. 1-8, FIGS. 1-8 illustrate a method for fabricating a semiconductor device according to an embodiment of the present invention, in which FIG. 1 illustrates a top view for fabricating the semiconductor device according to an embodiment of the present invention and FIGS. 2-11 illustrate cross-section views for fabricating the semiconductor device along the sectional lines AA', BB', and CC'. As shown in FIGS. 1-2, a substrate 12 such as a silicon substrate or silicon-on-insulator (SOI) substrate is provided and three or more transistor regions including a high voltage (HV) region 14, a medium-voltage (MV) region 16, and a low-voltage (LV) region 18 are defined on the substrate 12, in which at least a HV device 114 is disposed on the HV region 14, a MV device 116 is disposed on the MV region 16, the LV region 18 could further include a core region and/or an input/output (I/O) region, and a LV device 118 is disposed on the LV region 18. Preferably, FIGS. 2-11 are cross-section views illustrating a method for fabricating the semiconductor device taken along the sectional line AA' of the HV region 14, the sectional line BB' of the MV region 16, and the sectional line CC' of the LV region 18.

In this embodiment, the three regions 14, 16, 18 could be transistor regions having same conductive type or different conductive types. For instance, each of the three regions 14, 16, 18 could be a PMOS region or a NMOS region and the three regions 14, 16, 18 are defined to fabricate gate structures having different threshold voltages in the later process. Preferably, it would be desirable to first conduct an implantation process to form p-type deep wells on the HV region 14 and MV region 16 and a n-type deep well on the LV region 18, but not limited thereto.

Next, bases 20, 22 are formed on the HV region 14 and MV region 16 and a plurality of fin-shaped structures 24 are formed on the substrate 12 of the LV region 18. Preferably, the bases 20, 22 and the fin-shaped structures 24 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the bases 20, 22 and the fin-shaped structures 24 could also be obtained by first forming a patterned mask (not shown) on the substrate, 12, and through an etching process, the pattern of the patterned mask is transferred to the substrate 12 to form the bases 20, 22 and the fin-shaped structures 24. Moreover, the formation of the bases 20, 22 and the fin-shaped structures 24 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding the bases 20, 22 and fin-shaped structures 24. These approaches for forming the bases 20, 22 and fin-shaped structures 24 are all within the scope of the present invention.

In this embodiment, a liner 26, a liner 28, and a hard mask 30 could be formed on each of the bases 20, 22 and the fin-shaped structures 24 during the aforementioned patterning process, in which the liner 26 preferably includes silicon oxide ($SiO_2$), the liner 28 includes silicon nitride (SiN), and the hard mask 30 includes silicon oxide ($SiO_2$), but not limited thereto.

Figure 3:
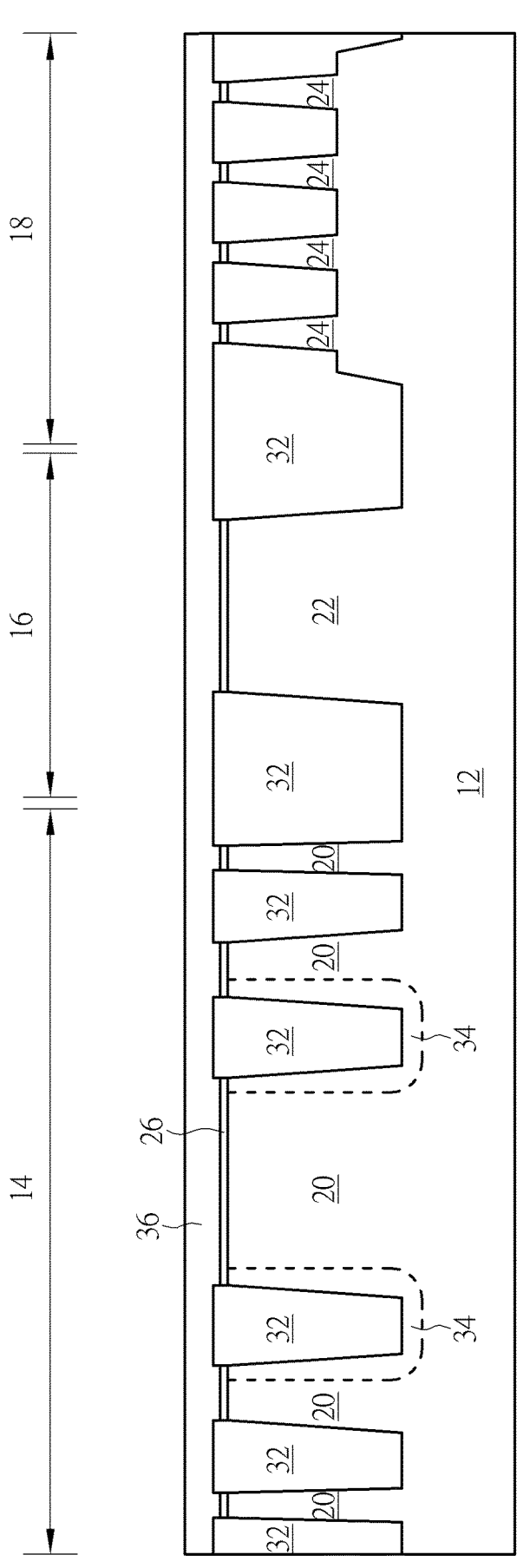

Next, as shown in FIG. 3, a flowable chemical vapor deposition (FCVD) process is conducted to form an insulating layer 32 made of silicon oxide on the bases 20, 22 and the fin-shaped structures 24 and filling the trenches between the bases 20, 22 and the fin-shaped structures 24, and a planarizing process such as chemical mechanical polishing (CMP) process is conducted to remove the hard mask 30 so that the top surfaces of the liner 28 and the insulating layer 32 are coplanar.

Next, the liner 28 made of silicon oxide is removed through etching process to expose the liner 26 made of silicon nitride underneath. As a result, the top surface of the insulating layer 32 becomes slightly higher than the top surface of the liner 26 and at the same time forming recesses (not shown) directly above the liner 26. Next, an ion implantation process is conducted to form doped regions 34 in the base 20 on the HV region 14, in which the doped regions 34 preferably serve as lightly doped drains (LDDs) for the HV device 114 formed afterwards. Next, a hard mask 36 is formed on the bases 20, 22 and fin-shaped structures 24 on the HV region 14, the MV region 16, and the LV region 18 and filling the recesses above the liner 26. In this embodiment, the hard mask 36 is preferably made of SiN, but not limited thereto.

Figure 4:
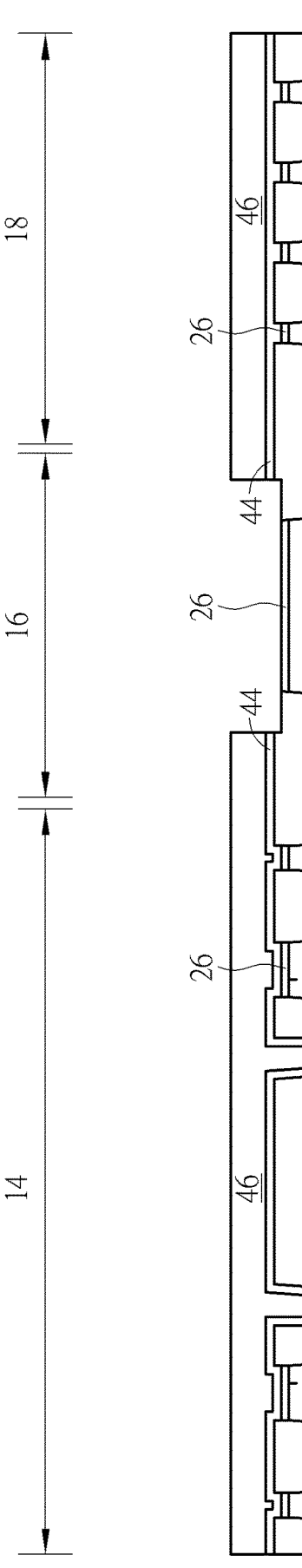

Next, as shown in FIG. 4, a patterned mask 38 such as a patterned resist is formed on the hard mask 36 on the MV region 16 and the LV region 18 as the patterned mask 38 includes an opening exposing the surface of the hard mask 36 on the HV region 14. Next, an etching process is conducted by using the patterned mask 38 as mask to remove part of the hard mask 36, part of the base 20, and part of the insulating layer 32 adjacent to two sides of the base 20 for forming a trench 40.

Next, after removing the patterned mask 38, an oxide growth process or more specifically a rapid thermal oxidation (RTO) process is conducted to form a gate dielectric layer 42 made of silicon oxide on the base 20 on the HV region 14, and the hard mask 36 is completely removed thereafter. Preferably, the remaining trench 40 formed by the patterned mask 38 is adjacent to two sides of the gate dielectric layer 42 and the top surface of the gate dielectric layer 42 is even with the top surface of the insulating layer 32 on both MV region 16 and LV region 18.

Next, another patterned mask (not shown) such as a patterned resist could be formed to cover the insulating layer 32 on the HV region 14 and MV region 16 as the patterned mask includes an opening exposing the top surface of the liner 26 and insulating layer 32 on the LV region 18, and then an ion implantation process is conducted to implant dopants into the fin-shaped structures 24 on the LV region 18 for adjusting threshold voltage (Vt) of the device. The patterned mask is then removed thereafter.

Next, a hard mask 44 made of SiN is formed on the HV region 14, the MV region 16, and the LV region 18 including the gate dielectric layer 42 on the HV region 14, the base 24 on the MV region 16, and the fin-shaped structures 24 on the LV region 18, and then another patterned mask 46 such as a patterned resist is formed on the insulating layer 32 on the HV region 14 and LV region 18, in which the patterned mask 46 includes an opening exposing the hard mask 44 on the MV region 16. Next, an etching process is conducted by using the patterned mask 46 as mask to remove the hard mask 44 on the MV region 16 for exposing the surface of the liner 26.

Figure 5:
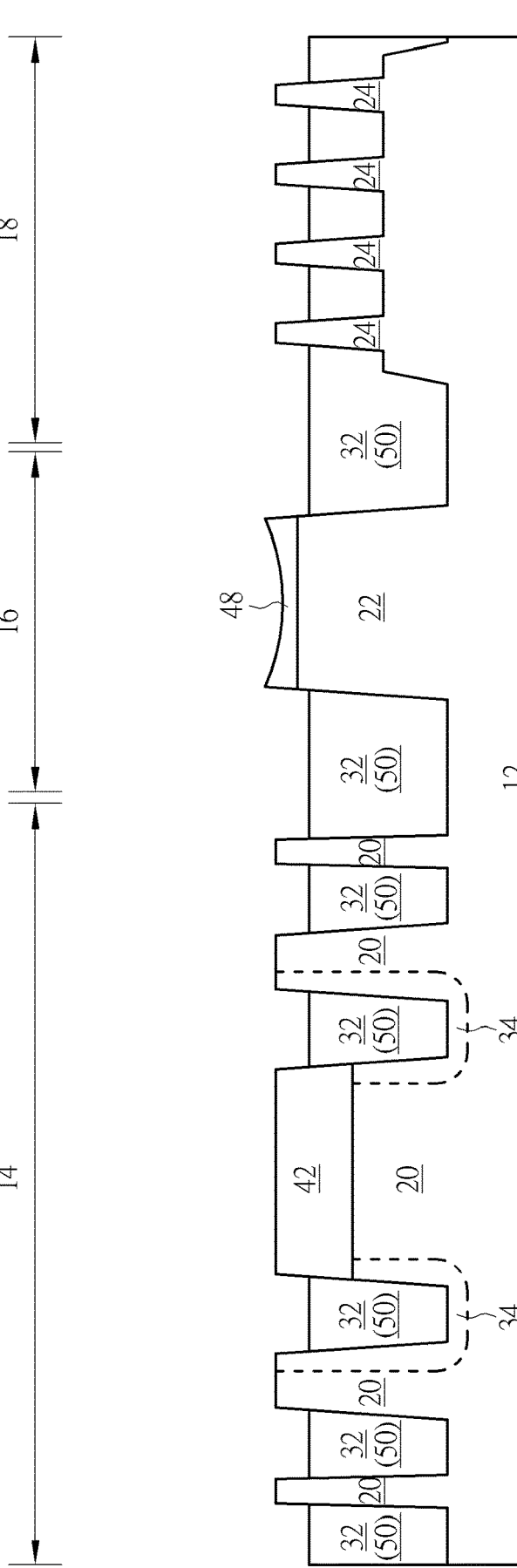

Next, as shown in FIG. 5, another oxide growth process such as a RTO process is conducted to form a gate dielectric layer 48 made of silicon oxide on the base 22 on MV region 16, in which the top surface of the gate dielectric layer 48 on the MV region 16 is higher than the top surface of the gate dielectric layer 42 on the HV region 14 while the thickness of the gate dielectric layer 42 on the HV region 14 is greater than the thickness of the gate dielectric layer 48 on the MV region 16. In this embodiment, the thickness of the gate dielectric layer 42 on the HV region 14 could be more than one time such as 1.5 times or even two times the thickness of the gate dielectric layer 48 on the MV region 16.

It should be noted that in contrast to conventional art of removing the liner 26 to expose the surface of the substrate 22 while forming a gate dielectric layer 48 on the MV region 16, the present invention preferably conducts a RTO process to oxide the base 22 directly to form a gate dielectric layer 48 while the liner 26 is still disposed on the surface of the base 22. In this embodiment, the central portion of the gate dielectric layer 48 and the peripheral portion of the gate dielectric layer 48 preferably have different thicknesses. For instance, a thickness closer to center of the gate dielectric layer 48 is different from a thickness closer to a first side such as left sidewall and a thickness closer to a second side such as right sidewall. Preferably, the thickness of the gate dielectric layer 48 at or closer to center is less than the thickness closer to its left sidewall and the thickness closer to its right sidewall, and the thickness of the gate dielectric layer 48 closer to its left sidewall could be equal to the thickness of the gate dielectric layer 48 closer to its right sidewall. Since the thickness of the gate dielectric layer 48 at relatively center region is less than the thickness closer to two sidewalls, the top surface of the gate dielectric layer 48 could include a curve or more specifically a curve concave upward.

Next, the patterned mask 46 and remaining hard mask 44 on the HV region 14, MV region 16, and LV region 18 are removed, and an etching process is conducted to completely remove the liner 26 on the fin-shaped structures 24 on the LV region 14 for exposing the top surface of the fin-shaped structures 24 and also remove part of the insulating layer 32 on the HV region 14, MV region 16, and LV region 18 so that the top surface of the insulating layer 32 is slightly lower than the top surface of the bases 20, 22 and the fin-shaped structures 24 for forming a shallow trench isolation (STI) 50. It should be noted that at this stage, the top surface of the gate dielectric layer 42 on the HV region 14 is substantially even with the top surface of the gate dielectric layer 48 on the MV region 16 and the top surface of the fin-shaped structures 24 on the LV region 18.

Figure 6:
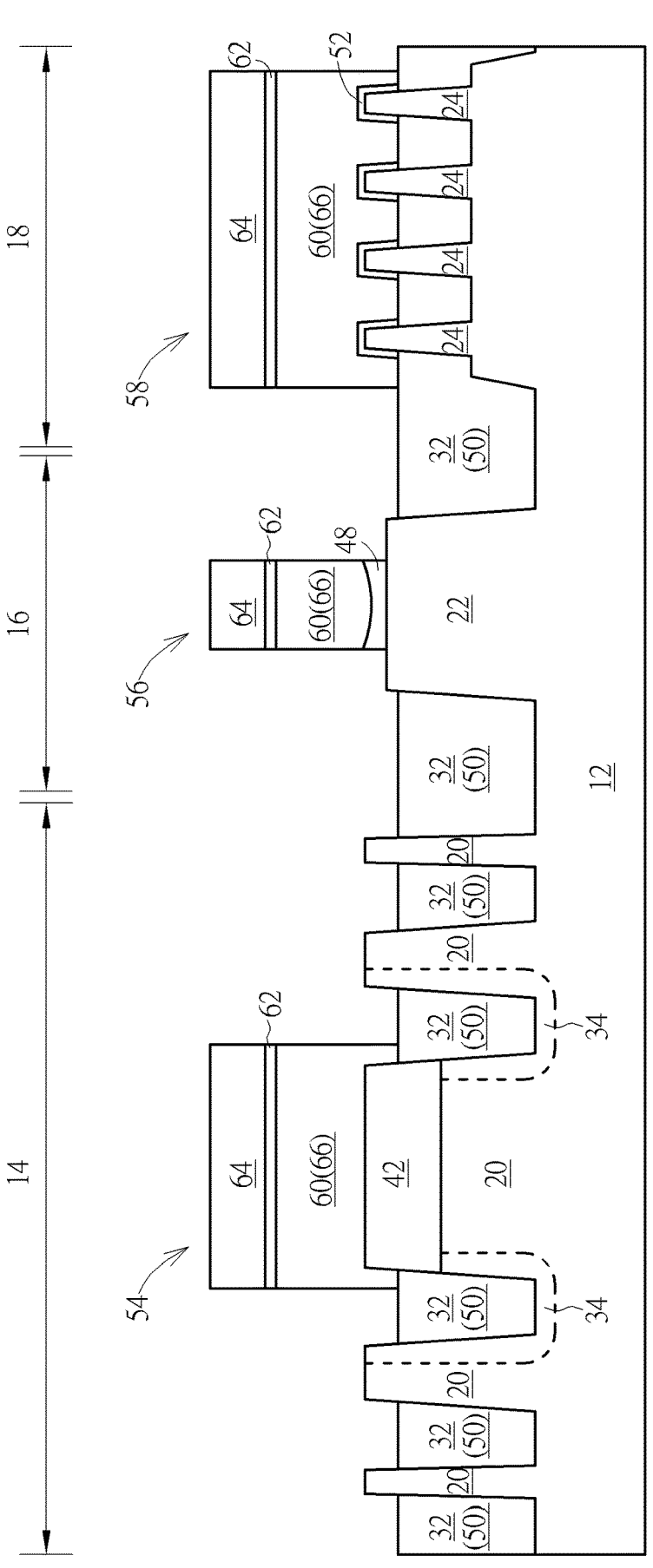

Next, as shown in FIG. 6, an oxidation process such as an in-situ steam generation (ISSG) process is conducted to form a gate dielectric layer 52 on the surface of fin-shaped structures 24 on the LV region 18. Next, gate structures 54, 56, 58 or dummy gates could be formed on the bases 20, 22 and the fin-shaped structures 24 on the HV region 14, MV region 16, and LV region 18. In this embodiment, the formation of the gate structures 54, 56, 58 could be accomplished by a gate first process, a high-k first approach from gate last process, or a high-k last approach from gate last process. Since this embodiment pertains to a high-k last approach, a gate material layer 60 preferably made of polysilicon, a hard mask 62 made of SiN, and a hard mask 64 made of silicon oxide could be formed sequentially on the gate dielectric layers 42, 48, 52, and a pattern transfer process is then conducted by using a patterned resist (not shown) as mask to remove part of the hard masks 62, 64 and part of the gate material layer 60 through single or multiple etching processes. After stripping the patterned resist, gate structures 54, 56, 58 composed of gate dielectric layers 42, 48, 52 respectively and patterned gate material layers 60 are formed on the substrate 12 on each region, in which the patterned gate material layer 60 becomes a gate electrode 66 on each region.

Next, at least a spacer (not shown) is formed on sidewalls of the gate structures 54, 56, 58. In this embodiment, the spacer could be a single spacer or a composite spacer, in which the spacer could further include an offset spacer (not shown) and a main spacer (not shown). The offset spacer and the main spacer are preferably made of different materials while the offset spacer and main spacer could all be selected from the group consisting of $SiO_2$, SiN, SiON, and SiCN, but not limited thereto.

Figure 7:
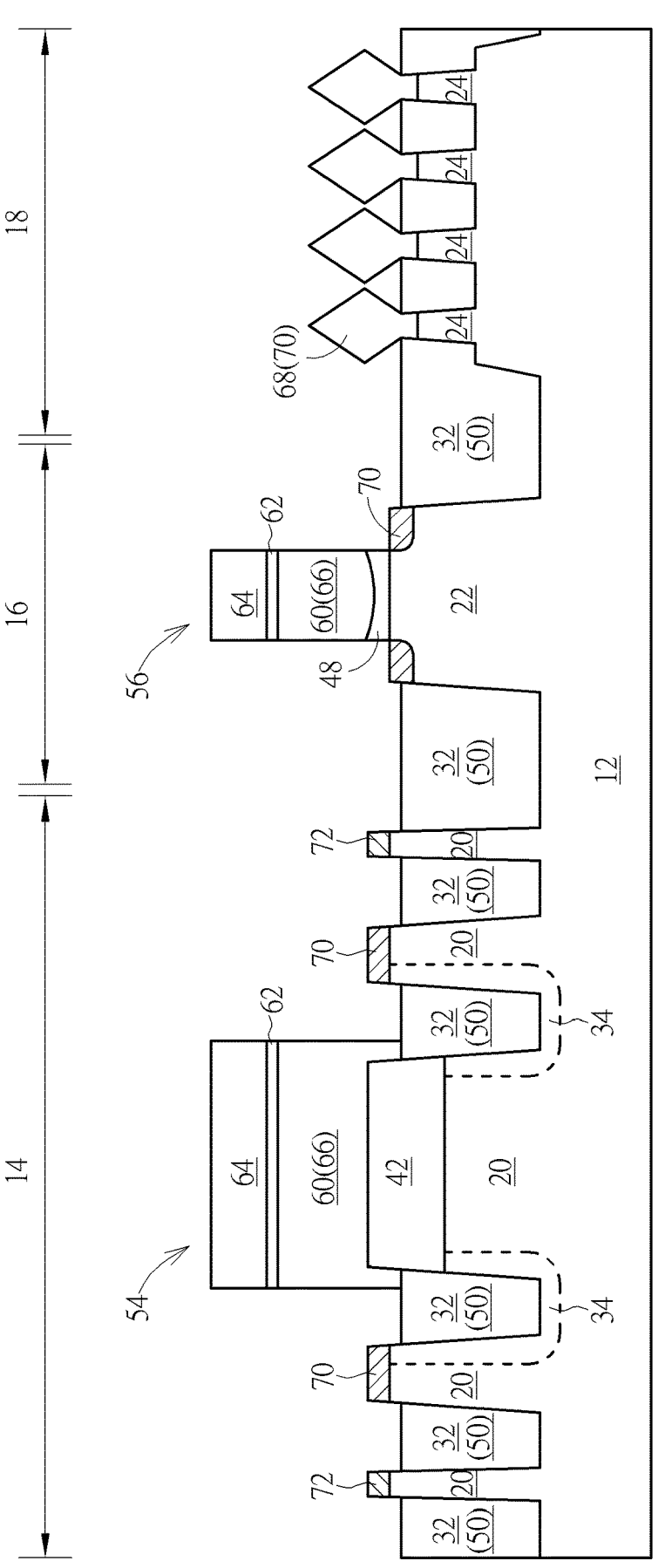

Referring to FIG. 7, FIG. 7 illustrates a method for fabricating a semiconductor device according to an embodiment of the present invention taken along the sectional line AA' of the HV region 14, the sectional line BB' of the MV region 16, and the sectional line DD' of the LV region 18. As shown in FIG. 7, one or more dry etching and/or wet etching process could be conducted by using the gate structure 58 and spacer on the LV region 18 as mask to remove part of the substrate 12 for forming recesses (not shown) adjacent to two sides of the gate structure 58. Next, a selective epitaxial growth (SEG) process is conducted to form epitaxial layers 68 in the recesses.

As shown in the cross-section view of FIG. 7, the epitaxial layers 68 on the LV region 18 also share substantially same cross-section shape with the recesses. For instance, the cross-section of each of the epitaxial layers 68 could also include a circle, a hexagon, or an octagon depending on the demand of the product. In this embodiment, the epitaxial layers 68 could also be formed to include different materials depending on the type of transistor being fabricated. For instance, if the MOS transistor being fabricated were to be a PMOS transistor, the epitaxial layers 68 could be made of material including but not limited to for example SiGe, SiGeB, or SiGeSn. If the MOS transistor being fabricated were to be a NMOS transistor, the epitaxial layers 68 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 68 is preferred to have less or no germanium atom at all to facilitate the formation of silicide afterwards.

Next, a photo-etching process could be conducted to remove part of the gate dielectric layer 48 on the MV region 16 for exposing the surface of the base 22 adjacent to two sides of the gate structure 56, and then one or more ion implantation process is conducted to form source/drain regions 70 in the bases 20, 22 adjacent to two sides of the gate structures 54, 56 on the HV region 14 and MV region 16 and at the same time form doped regions serving as an electrostatic discharge (ESD) protection ring 72 in the base 20 around the HV device 114 on the HV region 14. Preferably, the source/drain regions 70 and the ESD protection ring 72 on the HV region 14 include dopants of different conductive type. For instance, either one of the source/drain regions 70 and the ESD protection ring 72 could include n-type dopants while the other include p-type dopants.

According to an embodiment of the present invention, it would also be desirable to form source/drain regions 70 in part or all of the epitaxial layers 68 on the LV region 18. According to another embodiment of the present invention, the source/drain regions 70 could also be formed insituly during the SEG process. For instance, the source/drain regions 70 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain regions 70. Moreover, the dopants within the source/drain regions 70 could also be formed with a gradient, which is also within the scope of the present invention.

Figure 8:
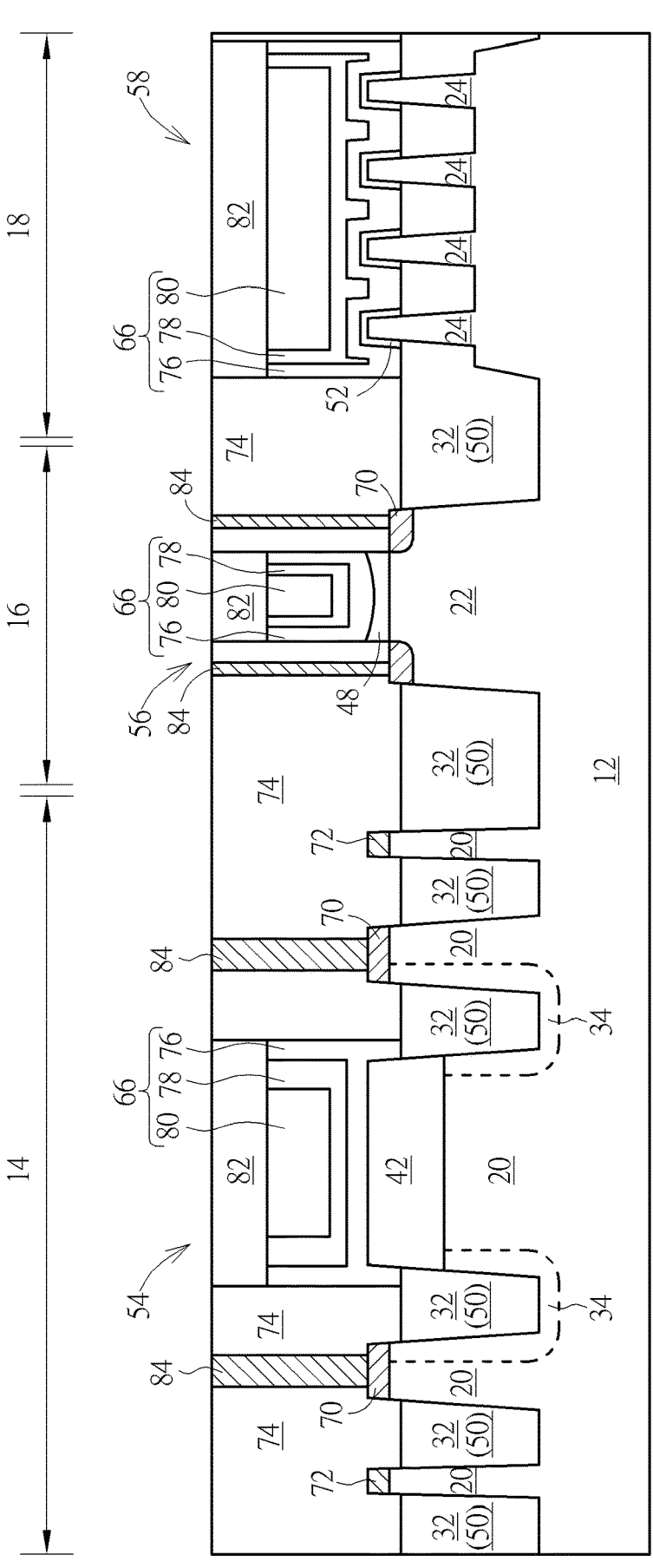

Next, as shown in FIG. 8, a selective contact etch stop layer (CESL) (not shown) could be formed on the substrate 12 surface to cover the gate structures 54, 56, 58 on the HV region 14, MV region 16, and LV region 18, and an interlayer dielectric (ILD) layer 74 is formed on the CESL afterwards. Next, a planarizing process such as a chemical mechanical polishing (CMP) process is conducted to remove part of the ILD layer 74 and part of the CESL so that the top surfaces of the hard mask 64 and ILD layer 74 are coplanar.

Next, a replacement metal gate (RMG) process is conducted to transform the gate structures 54, 56, 58 on the HV region 14, MV region 16, and LV region 18 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard masks 62, 64 and the gate material layers 60 from gate structures 54, 56, 58 for forming recesses (not shown) in the ILD layer 74. Next, a high-k dielectric layer 76, a work function metal layer 78, and a low resistance metal layer 80 are formed in the recesses, and a planarizing process such as CMP is conducted to remove part of low resistance metal layer 80, part of work function metal layer 78, and part of high-k dielectric layer 76 to form metal gates. Preferably, the high-k dielectric layer 76, the work function metal layer 78, and the low resistance metal layer 80 altogether constitute the gate electrode 66 of each of the transistors or devices.

In this embodiment, the high-k dielectric layer 76 is preferably selected from dielectric materials having dielectric constant (k value) larger than 4. For instance, the high-k dielectric layer 46 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 78 is formed for tuning the work function of the metal gate in accordance with the conductivity of the device. For an NMOS transistor, the work function metal layer 78 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 78 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 78 and the low resistance metal layer 50 may include titanium (Ti), titanium nitride (TiN), tantalum (Ta) or tantalum nitride (TaN). Furthermore, the material of the low-resistance metal layer 80 may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity. Next, part of the high-k dielectric layer 76, part of the work function metal layer 78, and part of the low resistance metal layer 80 are removed to form recesses (not shown), and a hard mask 82 is formed into each of the recesses so that the top surfaces of the hard masks 82 and the ILD layer 74 are coplanar. Preferably the hard masks 82 could include $SiO_2$, SiN, SiON, SiCN, or combination thereof.

Next, a photo-etching process is conducted by using a patterned mask (not shown) as mask to remove part of the ILD layer 74 and part of the CESL adjacent to the gate structures 54, 56, 58 for forming contact holes (not shown) exposing the source/drain regions 70 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 84 electrically connecting the source/drain regions 70. This completes the fabrication of a semiconductor device according to an embodiment of the present invention.

Figure 9:
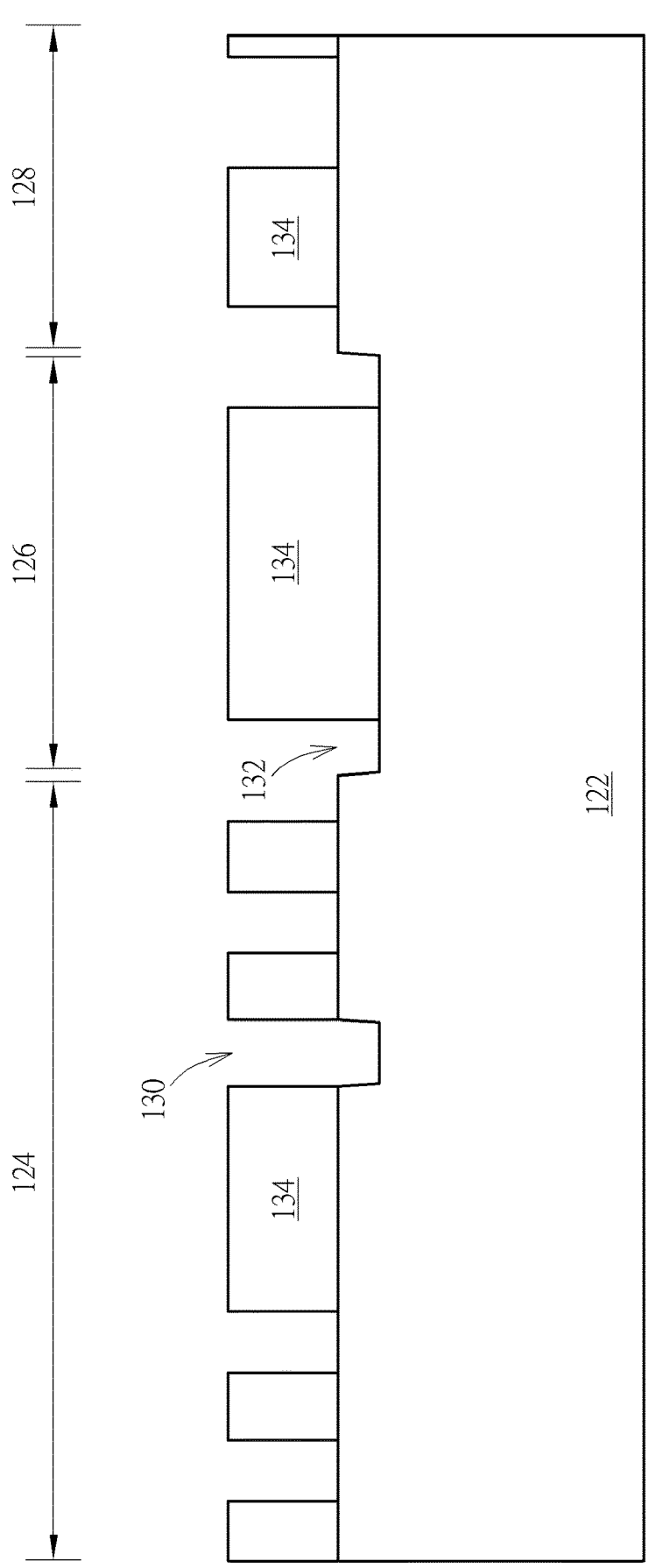

Referring to FIGS. 9-14, FIGS. 9-14 illustrate a method for fabricating a semiconductor device according to an embodiment of the present invention. As shown in FIG. 9, a substrate 122 such as a silicon substrate or silicon-on-insulator (SOI) substrate is provided and at least two or more transistor regions including a HV region 124, a MV region 126, and a LV region 128 are defined on the substrate 122, in which the HV region 124 is used for fabricating HV devices, the MV region 126 is sued for fabricating MV devices, and the LV region 128 is used for fabricating LV device and/or I/O devices.

Next, a photo-etching process could be conducted by using a patterned mask (not shown) such as patterned resist to remove part of the substrate 122 on the HV region 124 and MV region 126 through etching to form a trench 130 on the HV region 124 and a trench 132 on the MV region 126, and the patterned mask is removed thereafter. Preferably, the trench 130 and the trench 132 have same depths and the bottom surfaces of the trenches 130, 132 are coplanar.

Next, another photo-etching process is conducted by forming another patterned mask 134 such as patterned resist on the substrate 12 of the HV region 124, the MV region 126, and the LV region 128, in which the patterned mask 134 on the HV region 124 includes four openings exposing the substrate 122 and the trench 130, the patterned mask 134 on the MV region 126 includes openings exposing part of the trench 132 and the substrate 122 substrate adjacent to two sides of the trench 132, and the patterned mask 134 on the LV region 128 includes openings exposing part of the substrate 122 surface.

Figure 10:
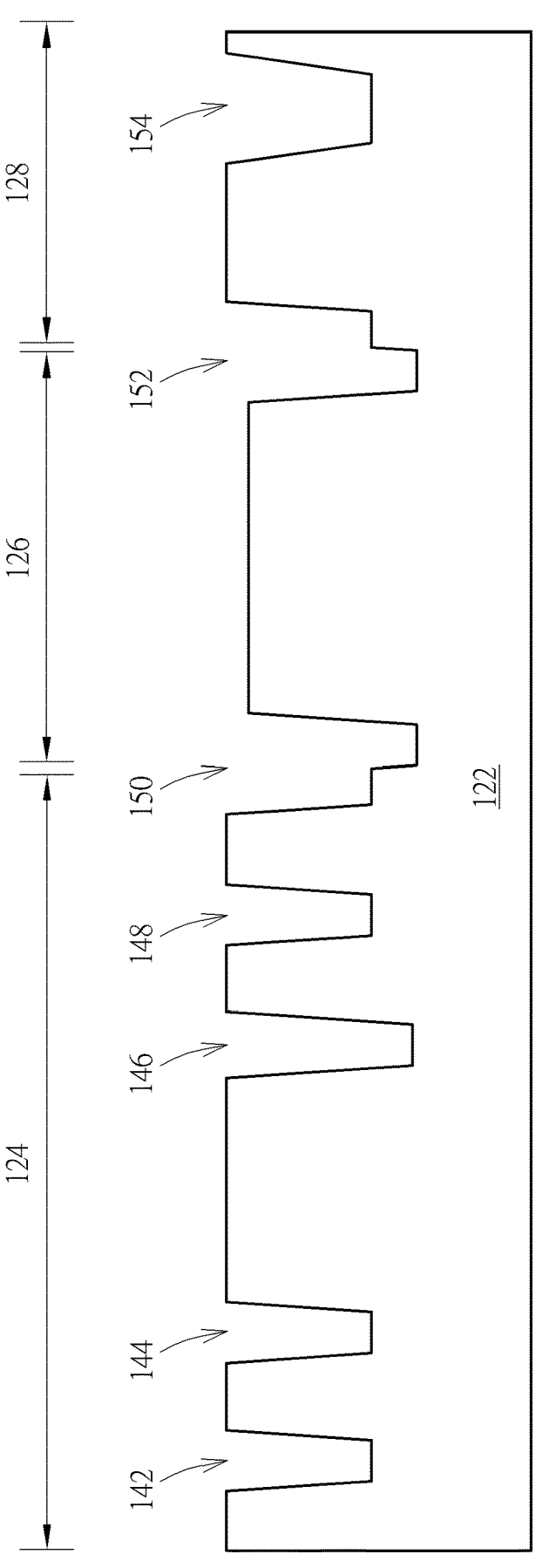

Next, as shown in FIG. 10, an etching process is conducted by using the patterned mask 134 as mask to remove part of the substrate 122 on the HV region 124, MV region 126, and LV region 128 to form a plurality of trenches 142, 144, 146, 148, 150, 152, 154 and the patterned mask 134 is removed thereafter. It should be noted that the trench 146 on the HV region 124 is formed by extending the aforementioned trench 130 downward so that the depth of the newly formed trench 146 is substantially greater than the other three trenches 142, 144, 148 or the bottom surface of the trench 146 is lower than the bottom surface of the trenches 142, 144, 148. The trenches 150, 152 on the MV region 126 are formed by extending the trench 132 downward through the patterned mask 134, in which the bottom surface of each of the trenches 150, 152 are formed with different depths to form step-shape profiles.

For instance, the bottom surface of the right portion of the left trench 150 is lower than the bottom surface of the left portion of the left trench 150, the bottom surface of the left portion of the right trench 152 is lower than the bottom surface of the right portion of the right trench 152, the bottom surface of the right portion of the left trench 150 is even with the bottom surface of the left portion of the right trench 152, and the bottom surface of the left portion of the left trench 150 is even with the bottom surface of the right portion of the right trench 152. Moreover, the bottom surface of the trench 146 on the HV region 124 is also even with the bottom surface of the right portion of the left trench 150 and the bottom surface of the left portion of the right trench 152 on the MV region 126.

Figure 11:
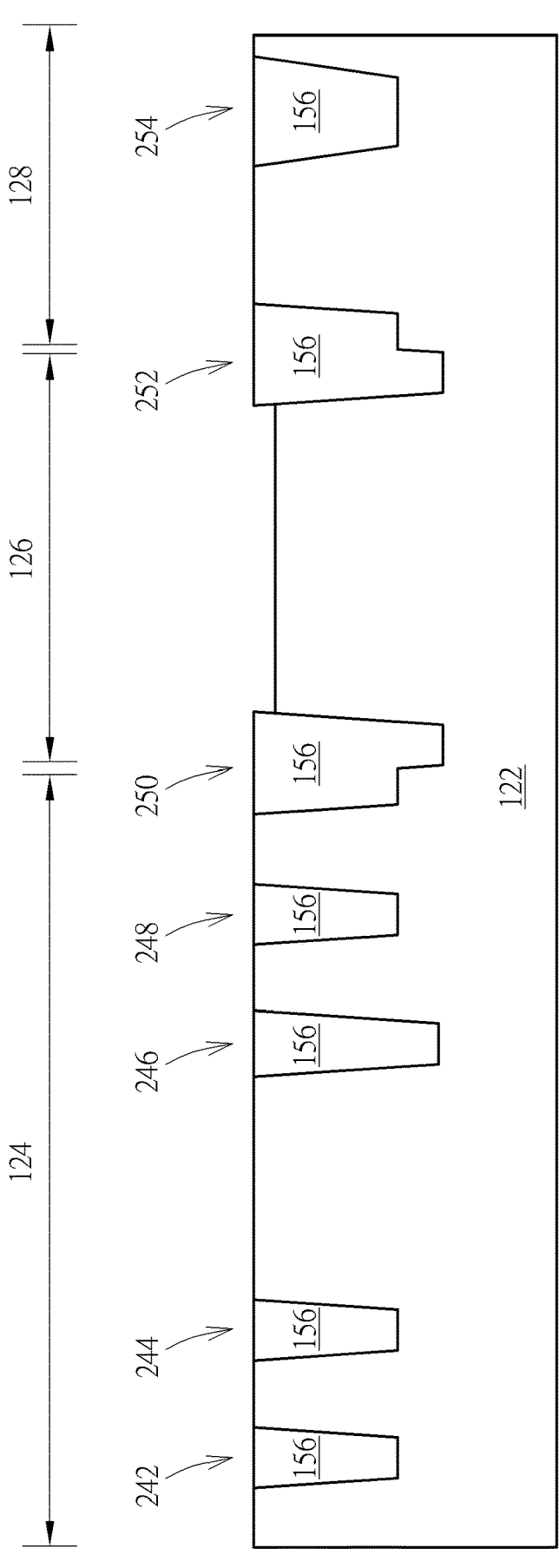

Next, as shown in FIG. 11, a dielectric layer 156 is formed to fill the trenches 142, 144, 146, 148, 150, 152, 154, and then a planarizing process such as chemical mechanical polishing (CMP) process is conducted to remove part of the dielectric layer so that the top surface of the remaining dielectric layer 156 is even with the top surface of the substrate 122 to form shallow trench isolations (STIs) 242, 244, 246, 248, 250, 252, 254 in the trenches 142, 144, 146, 148, 150, 152, 154.

Since the shape and depth of each of the STIs 242, 244, 246, 248, 250, 252, 254 are essentially the same as the trenches 142, 144, 146, 148, 150, 152, 154, the depths of the STIs 242, 244, 248 are preferably the same while the depth of the STI 246 is slightly greater than the depth of the STIs 242, 244, 248 or the bottom surface of the STI 246 is slightly lower than the bottom surface of the STIs 242, 244, 248. In the MV region 126, the bottom surface of the STIs 250, 252 are formed with different depths to form step-shape profiles.

For instance, the bottom surface of the right portion of the left STI 250 is lower than the bottom surface of the left portion of the left STI 250, the bottom surface of the left portion of the right STI 252 is lower than the bottom surface of the right portion of the right STI 252, the bottom surface of the right portion of the left STI 250 is even with the bottom surface of the left portion of the right STI 252, and the bottom surface of the left portion of the left STI 250 is even with the bottom surface of the right portion of the right STI 252. Moreover, the bottom surface of the STI 246 on the HV region 124 is also even with the bottom surface of the right portion of the left STI 250 and the bottom surface of the left portion of the right STI 152 on the MV region 126.

Figure 12:
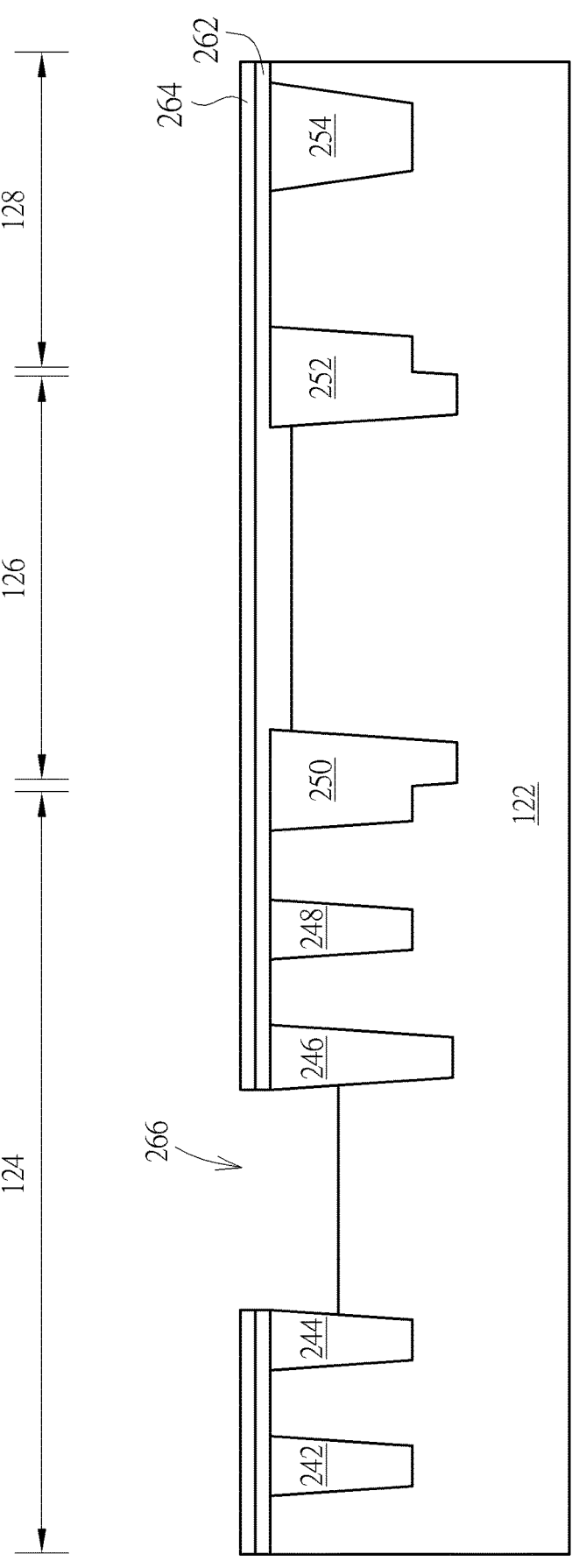

Next, as shown in FIG. 12, a liner 262 and a liner 264 are formed on the substrate 122 to cover the STIs 242, 244, 246, 248, 250, 252, 254, in which the liner 262 preferably includes silicon oxide while the liner 264 includes silicon nitride, but not limited thereto. Next, a photo-etching process is conducted by first forming a patterned mask such as patterned resist to cover part of the HV region 124, MV region 126, and LV region 128 and expose the liner 264 surface between the STIs 244, 246 and then conducting an etching process by using the patterned mask as mask to remove part of the liner 262, part of the liner 264, and part of the substrate 122 for forming a trench 266. The patterned mask is then stripped thereafter.

Figure 13:
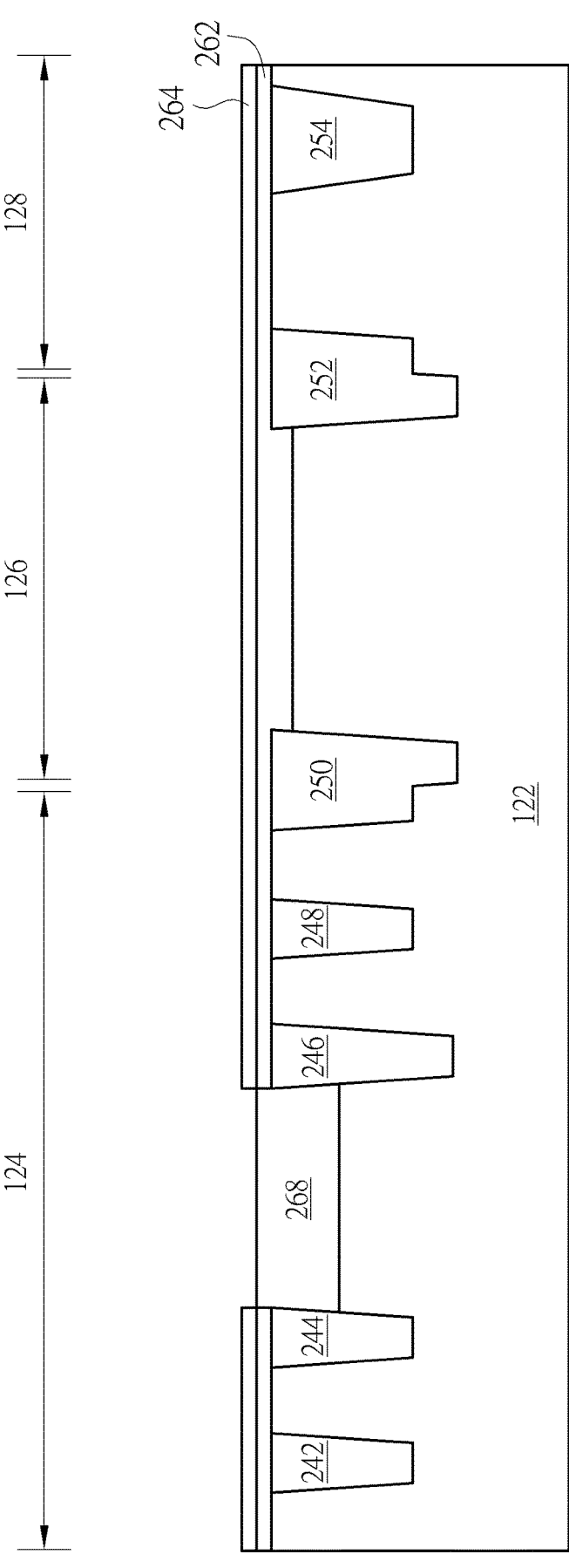

Next, as shown in FIG. 13, an oxide growth process or more specifically a rapid thermal oxidation (RTO) process is conducted to form a gate dielectric layer 268 made of silicon oxide on the substrate 122 of the HV region 14.

Figure 14:
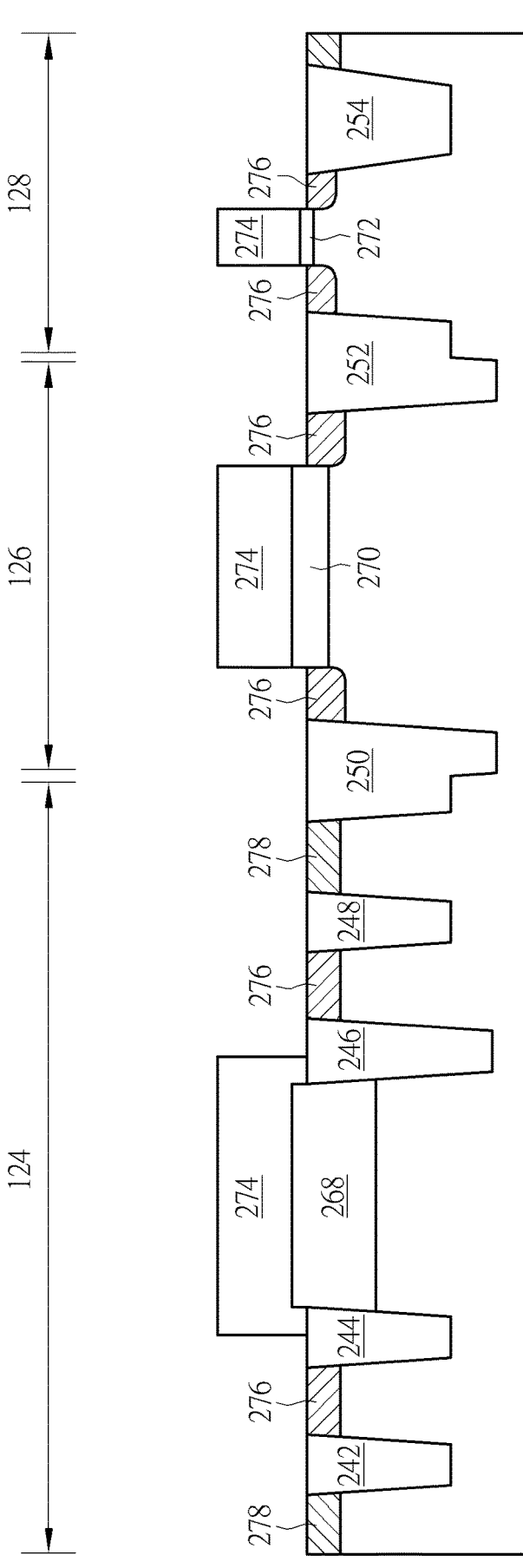

Next, as shown in FIG. 14, after removing the liners 262, 264, one or more oxide growth process such as a RTO process and/or in-situ steam generation (ISSG) process are conducted to form a gate dielectric layer 270 made of silicon oxide on the MV region 126 and another gate dielectric layer 272 also made of silicon oxide on the LV region 128. In this embodiment, the top surface of the gate dielectric layer 268 on the HV region 124 could be even with or not even with the top surface of the gate dielectric layer 270 on the MV region 126 and the top surface of the gate dielectric layer 272 on the LV region 128.

Next, transistor elements including gate structures 274 or dummy gates made of polysilicon and source/drain regions 276 are formed on the HV region 124, the MV region 126, and the LV region 128, and an electrostatic discharge (ESD) protection ring 278 is formed outside the source/drain region 276 on the HV region 124. Next, a replacement metal gate (RMG) process could be conducted to transform the gate structures 274 on the HV region 124, MV region 126, and LV region 128 into metal gates. Preferably, each of the gate structures 274 after being transformed into metal gates could include elements such as a high-k dielectric layer, a work function metal layer, and a low resistance metal layer. Since the transformation of metal gate from polysilicon gate is well known to those skilled in the art, the details of which are not explained herein for the sake of brevity. This completes the fabrication of a semiconductor device according to an embodiment of the present invention. By using the process conducted in FIGS. 9-14 for fabricating the semiconductor devices, it would be desirable to improve breakdown voltage on the HV region and shrink overall area of the HV region without increasing any cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having a high-voltage (HV) region and a medium-voltage (MV) region;
   forming a first trench on the HV region;
   forming a second trench adjacent to the first trench and extending the first trench to form a third trench;
   forming a first shallow trench isolation (STI) in the second trench and a second STI in the third trench, wherein a bottom surface of the second STI is lower than a bottom surface of the first STI; and
   forming a first gate structure and source/drain regions on the HV region, wherein the first gate structure is disposed between the first STI and the second STI, and the first STI and the second STI are disposed between the first gate structure and the source/drain regions, respectively.

2. The method of claim 1, further comprising:
   forming the first trench on the HV region and a fourth trench on the MV region;
   forming the second trench, the third trench, and extending the fourth trench to form a fifth trench and a sixth trench;
   forming a dielectric layer in the second trench, the third trench, the fifth trench, and the sixth trench;
   planarizing the dielectric layer to form the first STI, the second STI, a third STI in the fifth trench, and a fourth STI in the sixth trench;
   forming a first gate dielectric layer between the first STI and the second STI;
   forming a second gate dielectric layer between the third STI and the fourth STI;
   forming the first gate structure on the first gate dielectric layer; and
   forming a second gate structure on the second gate dielectric layer.

3. The method of claim 2, wherein top surfaces of the first STI and the third STI are coplanar.

4. The method of claim 2, wherein the third STI comprises a left portion and a right portion and a bottom surface of the right portion is lower than a bottom surface of the left portion.

5. The method of claim 4, wherein the bottom surface of the right portion of the third STI is even with the bottom surface of the second STI.

6. The method of claim 4, wherein the fourth STI comprises a left portion and a right portion and a bottom surface of the left portion is lower than a bottom surface of the right portion.

7. The method of claim 6, wherein the bottom surface of the left portion of the fourth STI is even with the bottom surface of the second STI.

8. The method of claim 6, wherein the bottom surface of the right portion of the third STI is even with the bottom surface of the left portion of the fourth STI.

9. A semiconductor device, comprising:
   a substrate having a high-voltage (HV) region and a medium-voltage (MV) region;
   a first shallow trench isolation (STI) and a second STI in the substrate of the HV region, wherein a bottom surface of the second STI is lower than a bottom surface of the first STI; and
   a first gate structure and source/drain regions on the HV region, wherein the first gate structure is disposed between the first STI and the second STI, and the first STI and the second STI are disposed between the first gate structure and the source/drain regions, respectively.

10. The semiconductor device of claim 9, further comprising:
   a third STI and a fourth STI in the substrate of the MV region;
   a first gate dielectric layer between the first STI and the second STI;
   a second gate dielectric layer between the third STI and the fourth STI;
   the first gate structure on the first gate dielectric layer; and
   a second gate structure on the second gate dielectric layer.

11. The semiconductor device of claim 10, wherein top surfaces of the first STI and the third STI are coplanar.

12. The semiconductor device of claim 10, wherein the third STI comprises a left portion and a right portion and a bottom surface of the right portion is lower than a bottom surface of the left portion.

13. The semiconductor device of claim 12, wherein the bottom surface of the right portion of the third STI is even with the bottom surface of the second STI.

14. The semiconductor device of claim 12, wherein the fourth STI comprises a left portion and a right portion and a bottom surface of the left portion is lower than a bottom surface of the right portion.

15. The semiconductor device of claim 14, wherein the bottom surface of the left portion of the fourth STI is even with the bottom surface of the second STI.

16. The semiconductor device of claim 14, wherein the bottom surface of the right portion of the third STI is even with the bottom surface of the left portion of the fourth STI.

17. A semiconductor device, comprising:
   a substrate having a high-voltage (HV) region and a medium-voltage (MV) region;
   a first shallow trench isolation (STI) and a second STI in the substrate of the MV region; and
   a first gate dielectric layer between the first STI and the second STI, wherein the first gate dielectric layer has a concave-shaped top surface.

18. The semiconductor device of claim 17, wherein the first gate dielectric layer has a first thickness at a center thereof and a second thickness at a first sidewall thereof, and the first thickness is less than the second thickness.

19. The semiconductor device of claim 18, wherein the first gate dielectric layer has a third thickness at a second sidewall opposite to the first sidewall relative to the center, and the first thickness is less than the third thickness.

20. The semiconductor device of claim 19, wherein the second thickness is equal to the third thickness.

\* \* \* \* \*